United States Patent
Finnegan

(10) Patent No.: US 7,940,518 B2
(45) Date of Patent: May 10, 2011

(54) DUAL FRAME ELECTRONIC DISPLAY

(75) Inventor: Dean Finnegan, Dublin, CA (US)

(73) Assignee: Pandigital, Inc., Dublin, CA (US)

( * ) Notice: Subject to any disclaimer, the term of this patent is extended or adjusted under 35 U.S.C. 154(b) by 251 days.

(21) Appl. No.: 11/697,616

(22) Filed: Apr. 6, 2007

(65) Prior Publication Data

US 2008/0247127 A1    Oct. 9, 2008

Related U.S. Application Data

(60) Provisional application No. 60/909,901, filed on Apr. 3, 2007.

(51) Int. Cl.
*G06F 1/16* (2006.01)
*H05K 5/00* (2006.01)
*H05K 7/00* (2006.01)

(52) U.S. Cl. .................................................. 361/679.21

(58) Field of Classification Search .................. 361/681, 361/679.02, 679.21, 679.01; 40/448, 606.01, 40/700, 725, 606.1
See application file for complete search history.

(56) References Cited

U.S. PATENT DOCUMENTS

| | | | | |
|---|---|---|---|---|
| 4,422,728 A * | 12/1983 | Andreaggi | 349/60 |
| 5,328,145 A * | 7/1994 | Charapich | 248/442.2 |
| 5,450,221 A * | 9/1995 | Owen et al. | 349/58 |
| 5,486,942 A * | 1/1996 | Ichikawa et al. | 349/58 |
| 5,570,267 A * | 10/1996 | Ma | 361/679.21 |
| 6,151,207 A * | 11/2000 | Kim | 361/679.26 |
| 6,310,767 B1 * | 10/2001 | Spear et al. | 361/679.24 |
| 6,550,172 B2 * | 4/2003 | Korpai | 40/725 |
| 6,563,705 B1 * | 5/2003 | Kuo | 361/679.54 |
| 6,574,896 B1 * | 6/2003 | Howell | 40/737 |
| 6,574,897 B1 * | 6/2003 | Timmer | 40/777 |
| 6,688,576 B2 * | 2/2004 | Oishi et al. | 248/317 |
| 6,826,863 B1 * | 12/2004 | Goodfellow | 361/681 |
| D512,433 S * | 12/2005 | Korpai | D14/450 |
| 7,002,792 B2 * | 2/2006 | Han et al. | 361/679.21 |
| 7,106,578 B2 * | 9/2006 | Chen | 361/681 |
| D533,181 S * | 12/2006 | Florindo | D14/450 |
| 7,175,242 B2 * | 2/2007 | Lee et al. | 312/7.2 |
| 7,236,357 B2 * | 6/2007 | Chen | 361/681 |
| 7,426,799 B2 * | 9/2008 | Christianson et al. | 40/725 |
| 7,441,360 B2 * | 10/2008 | Christianson et al. | 40/725 |
| 7,441,361 B2 * | 10/2008 | Rowan | 40/743 |
| 2001/0037593 A1 * | 11/2001 | Korpai | 40/725 |
| 2004/0150943 A1 * | 8/2004 | Rock | 361/681 |
| 2005/0047067 A1 * | 3/2005 | Bang et al. | 361/681 |
| 2005/0285990 A1 * | 12/2005 | Havelka et al. | 349/58 |
| 2006/0028790 A1 * | 2/2006 | Baek | 361/681 |
| 2006/0055839 A1 * | 3/2006 | Hirao et al. | 349/58 |
| 2008/0094787 A1 * | 4/2008 | Kabeya | 361/681 |

* cited by examiner

*Primary Examiner* — Anatoly Vortman
*Assistant Examiner* — Adrian S Wilson
(74) *Attorney, Agent, or Firm* — Vierra Magen Marcus & DeNiro LLP

(57) ABSTRACT

A digital media apparatus includes display provided in a display housing, the housing having a front portion and a rear portion, and including a mounting region defined at an edge of the housing. A first frame element may be mounted to the display housing by passing the rear portion of the housing through an opening in the first frame element to allow the element to engage the mounting region. A second frame element may be mounted to the display housing by passing a front portion of the display housing into a cavity in the frame element and securing the element to the housing by a fastener.

18 Claims, 7 Drawing Sheets

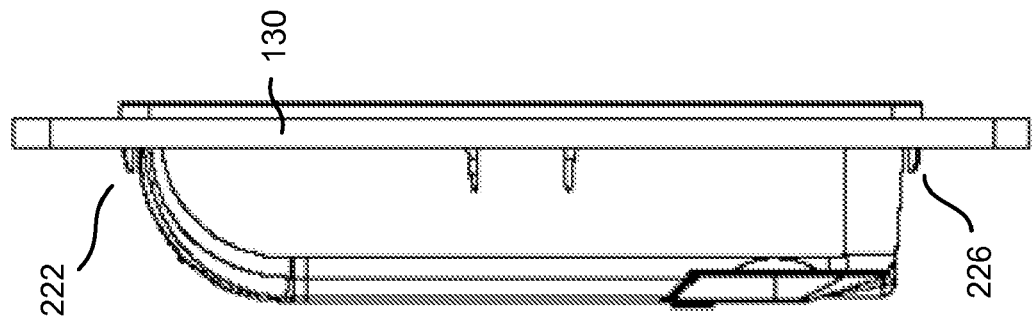
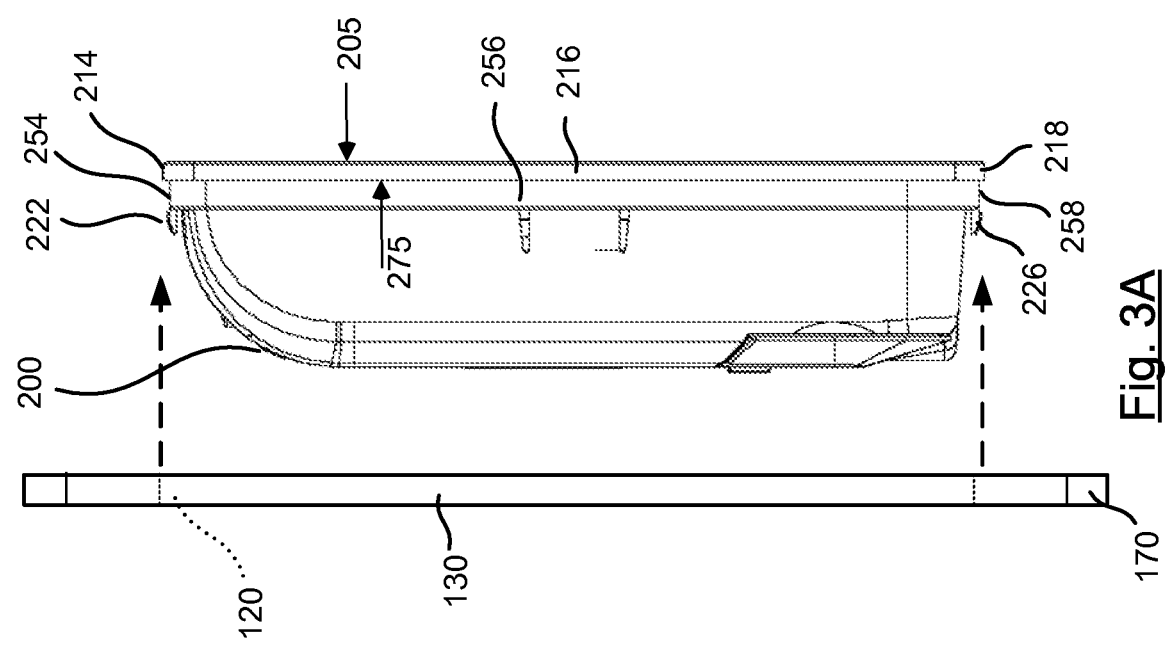

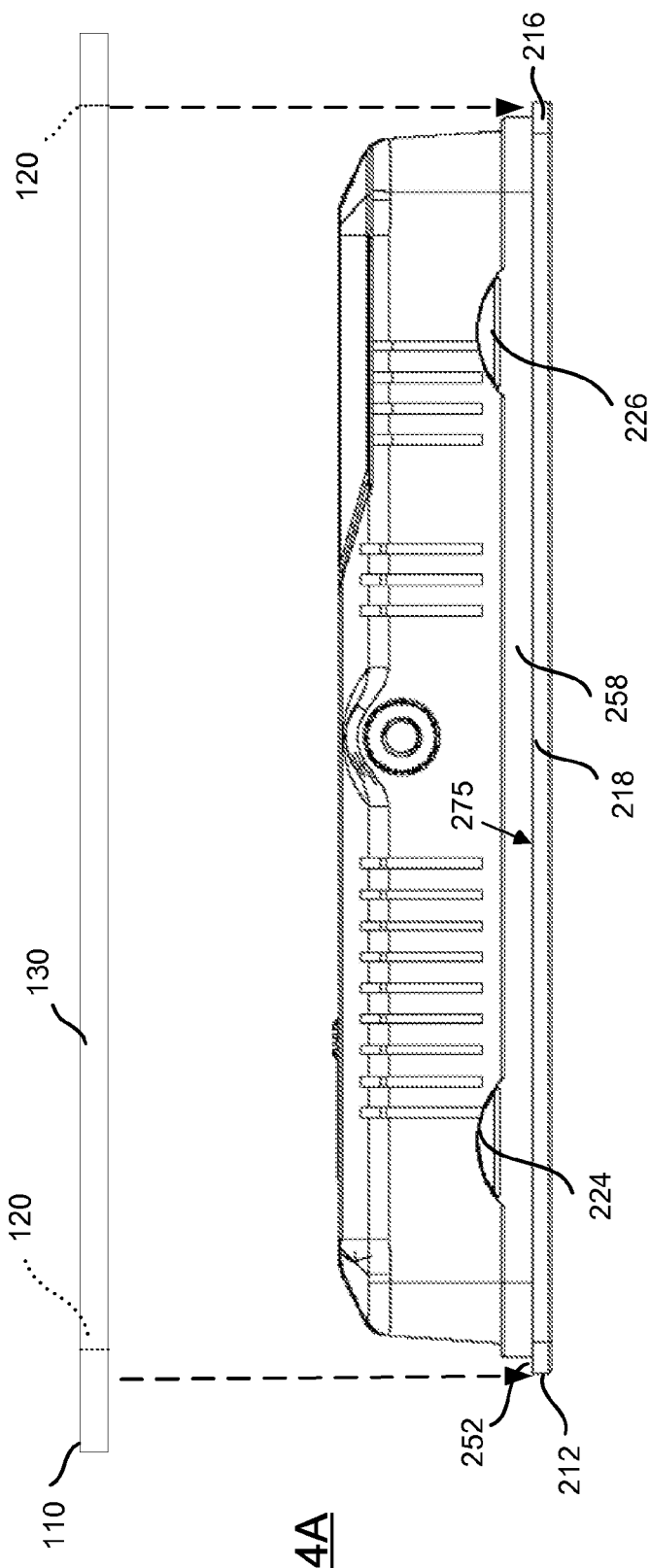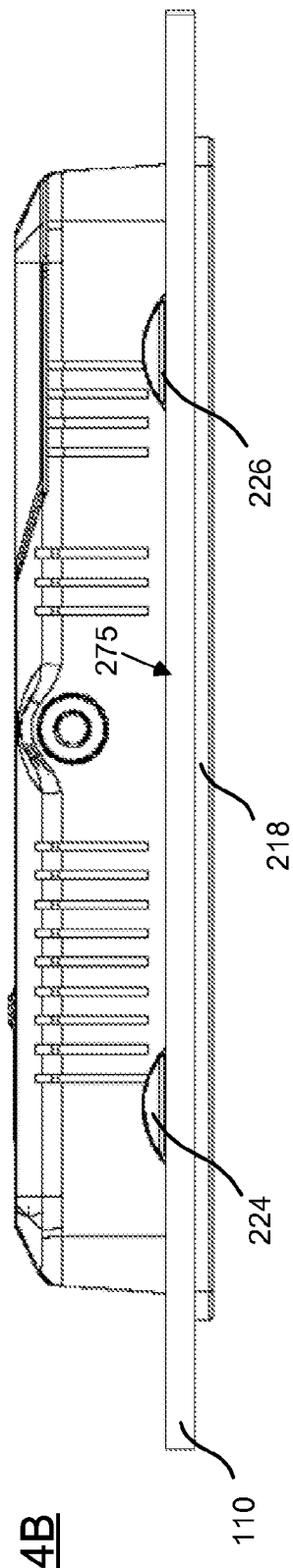

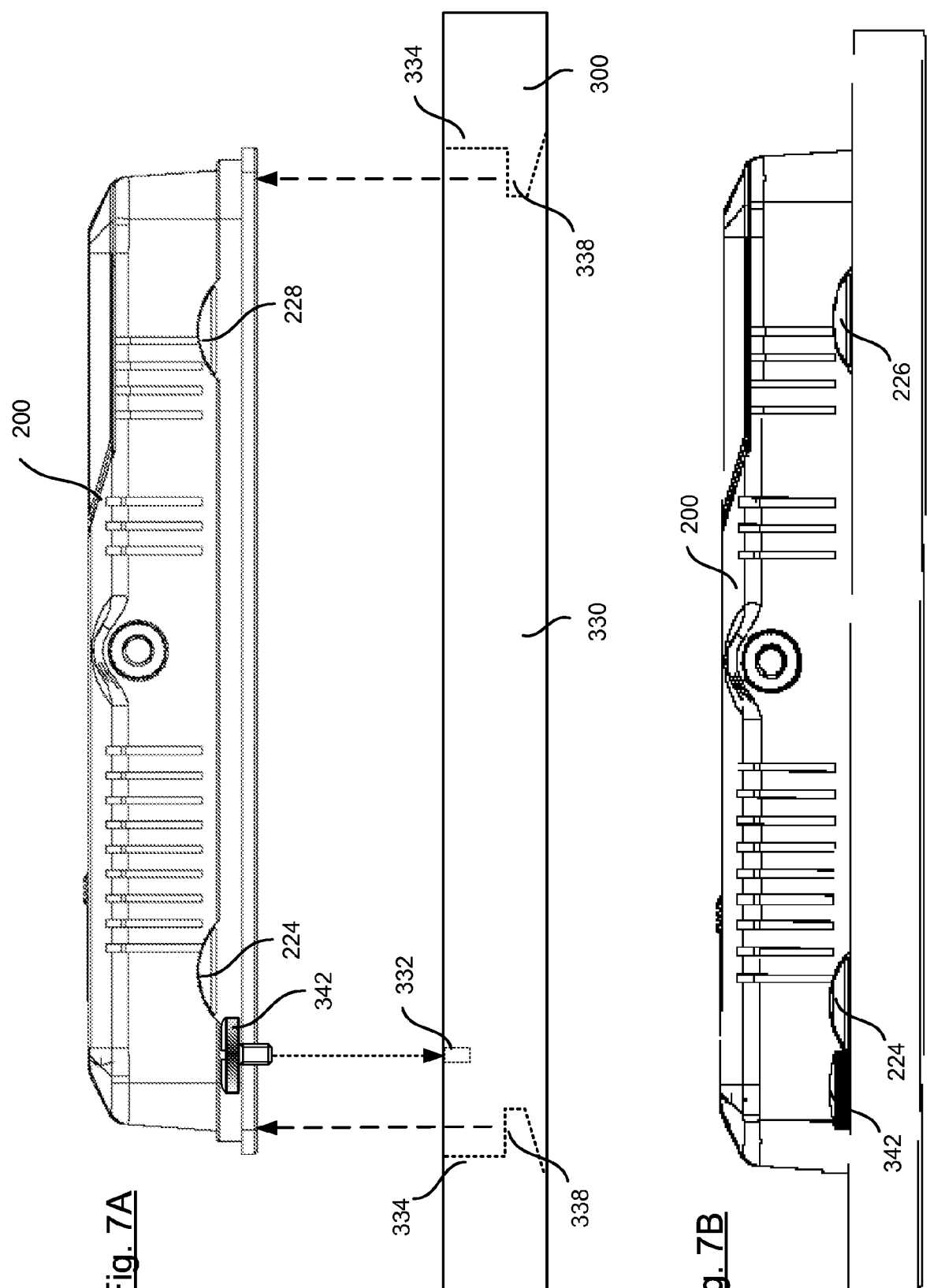

DUAL FRAME ELECTRONIC DISPLAY

CLAIM OF PRIORITY

This application claims priority to U.S. Provisional Application No. 60/909,901 filed Apr. 3, 2007, entitled "Dual Frame Electronic Display" which is incorporated herein by reference.

BACKGROUND

With the increasing popularity of digital photography, digital picture frames have become a popular means of displaying digital photos. Typically, a digital picture frame includes a display such as a liquid crystal display (LCD) having a display screen encased in a plastic or wooden frame made to resemble a printed picture frame. An example of this is shown in U.S. Pat. No. 6,826,863 wherein a number of various means are shown for attaching a surrounding frame to the display apparatus. The surrounding frame is attached to the outside of the display, and is positioned at the front of the display so as to resemble a conventional picture frame housing displaying a printed picture.

SUMMARY

A digital media apparatus, which in one embodiment is a digital picture frame, is disclosed. The frame allows a user to attach two different types of frame elements, each lending a different appearance to the digital media apparatus.

In one embodiment, the apparatus includes a display provided in a display housing, the housing having a front portion and a rear portion, and including a mounting region defined at an edge of the housing. A first frame element may be mounted to the display housing by passing the rear portion of the housing through an opening in the first frame element to allow the element to engage the mounting region. A second frame element may be mounted to the display housing by passing a front portion of the display housing into a cavity in the frame element and securing the element to the housing by a fastener.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 3A is an unassembled side view of a picture frame in accordance with the apparatus shown in FIGS. 1A and 1B.

FIG. 3B is an assembled view of the apparatus shown in FIG. 3A.

FIG. 4A is an unassembled bottom view of the apparatus shown in FIGS. 1A and 1B.

FIG. 4B is an assembled bottom view of the apparatus shown in FIG. 4A.

FIGS. 7A and 7B are disassembled and assembled bottom views, respectively, of the apparatus shown in FIGS. 2A and 2B.

DETAILED DESCRIPTION

A dual frame electronic media display apparatus is disclosed herein. The dual frame electronic display allows the user of the display to decide between two or more different types of display frame elements which can attach to a digital picture display. This allows a user of the frame to decide between various different stylistic frames which better match the user's décor and to change the frame to match the décor on an ongoing basis.

In one aspect, the frame elements may be attached from the rear or to the front of the display, thereby providing a different stylistic effect to the frame. While the invention is described with respect to the display of digital pictures, it will be further understood that other media may be displayed or performed by the digital display device.

Figure 1A:
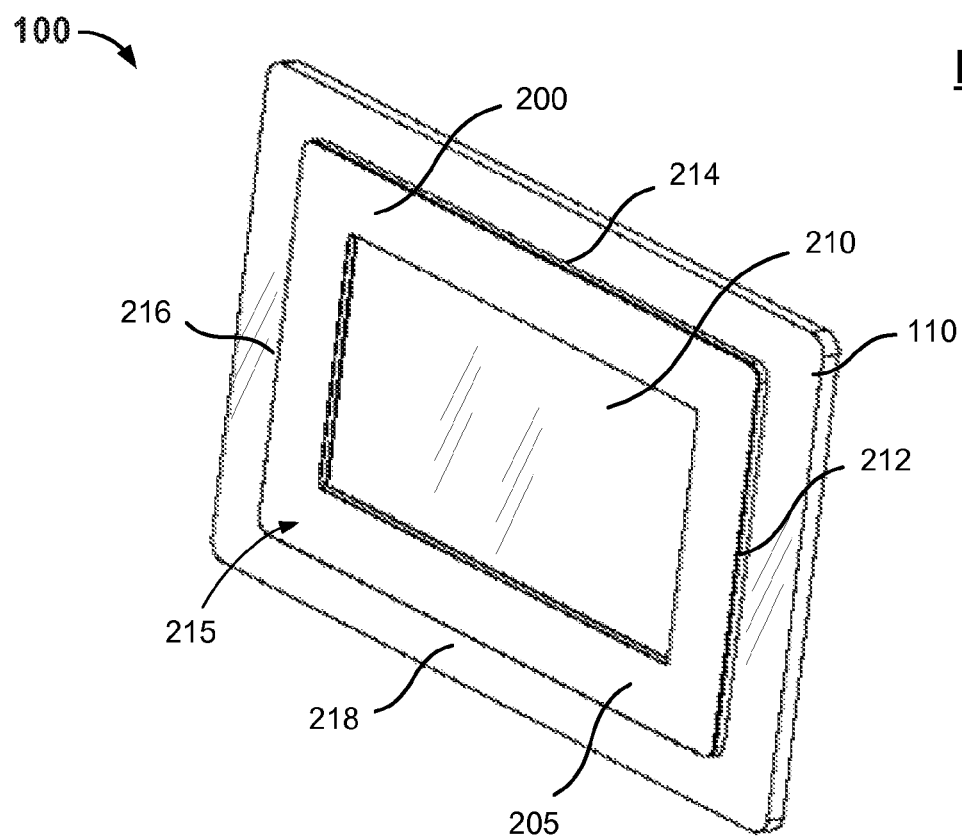
FIGS. 1A and 1B are a front and rear view, respectively, of a picture frame apparatus in accordance with the present invention.
Figure 1B:
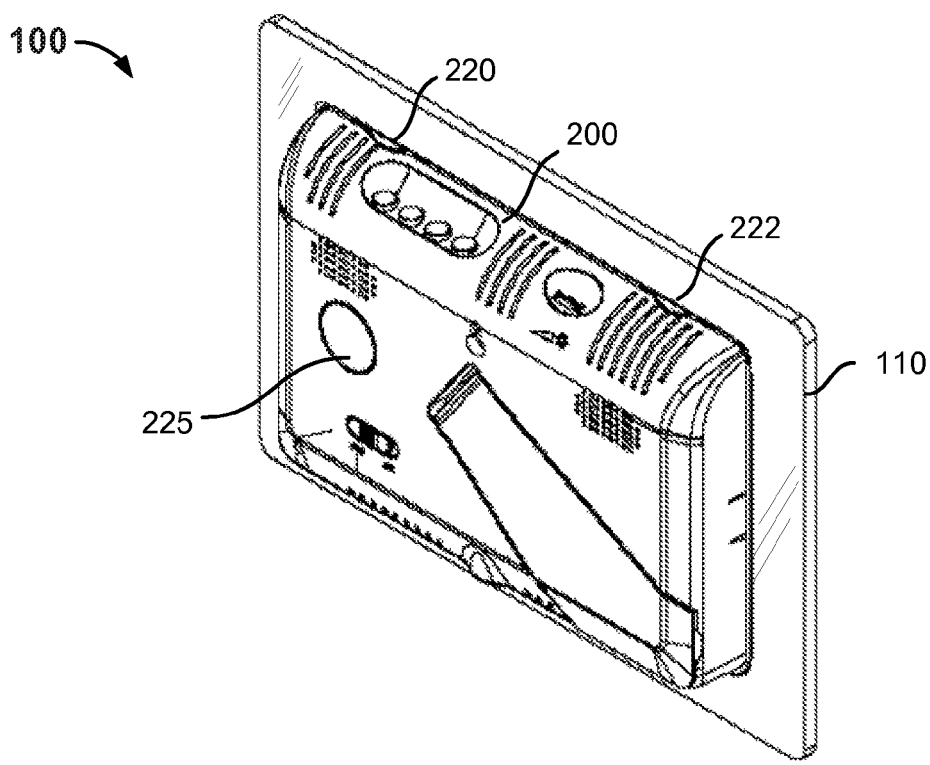
Figure 2A:
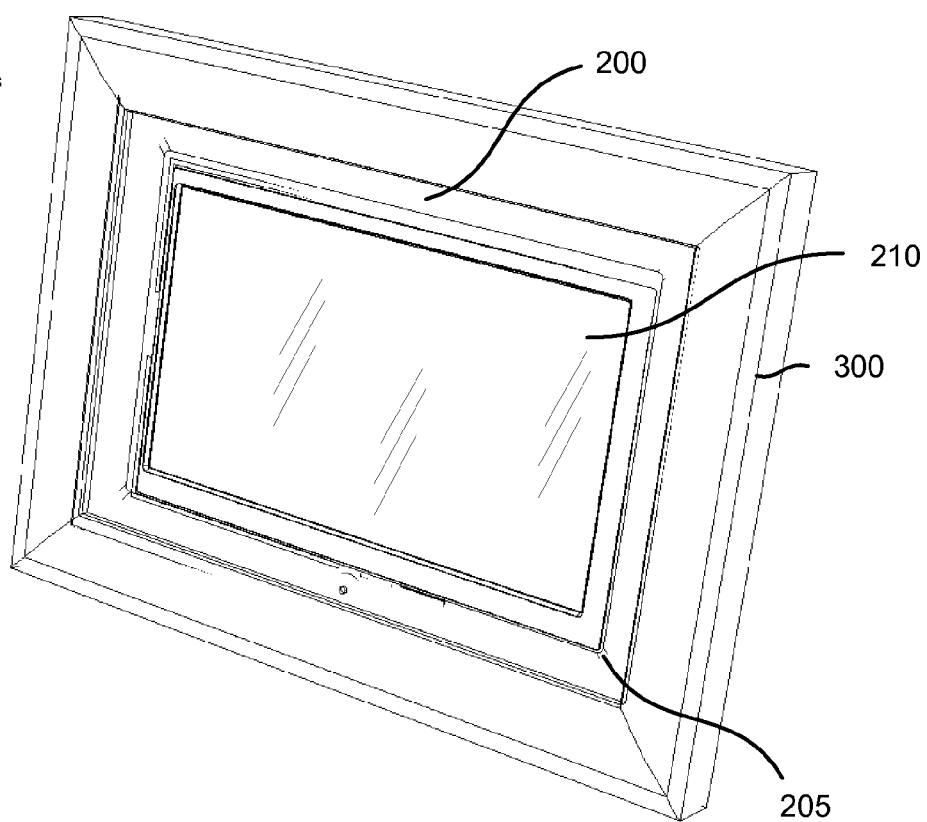
FIGS. 2A and 2B are a front and rear perspective views, respectively, of a picture frame apparatus in accordance with the present invention.
Figure 2B:
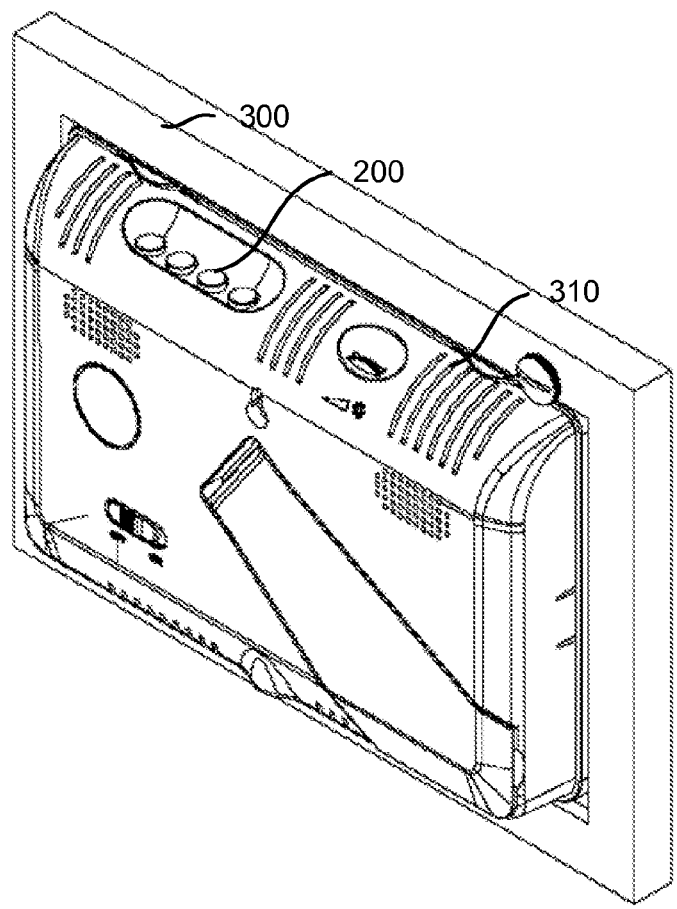

FIGS. 1A and 1B show a first implementation of the electronic picture frame using a contemporary plastic translucent frame which mounts from the rear of the display. FIGS. 2A and 2B show an implementation of the frame using a traditional wooden frame element which mounts to the front of the display.

FIGS. 1A and 1B are front and rear perspective views of a picture frame apparatus 100 having a first type frame element, designed to provide a contemporary style. In this example, the frame element may be a plastic frame element 110 surrounding a display 200. The frame element may be clear or solid plastic, and may include designs or be a solidly colored material.

Apparatus 100 includes a display housing 220 which includes a screen portion 210 for displaying electronic photos or movies, as well as other information. Display 200 includes, for example, an LCD display device commercially available from any number of manufacturers. The display housing 200 includes a front portion 215 and rear portion 225. The front portion 215 is shown in FIG. 1A and the rear portion 225 is shown in FIG. 1B. The display may also include circuitry and controls allowing the user to control the presentation of various media in the display screen. The rear portion shown in FIG. 1B includes various controls and housing elements which are not germane to the present invention. The housing 200 includes a face 205 having a top edge 214, bottom edge 218 and side edges 212 and 216. As explained below, the edges of face 215 form a lip which is used to secure frame element 110 onto housing 200. The face 215 includes a back 275. The lip formed by edges 212, 214, 216, 218 and back 275 form a mounting region for the frame elements.

FIGS. 2A and 2B show an embodiment of the frame apparatus 100 using a more traditional appearing frame element 300. The frame element 300 is secured to the housing 200 by the use of fasteners such as threaded screws 310, as described more fully below. The same housing 200 is used in both the examples shown in FIGS. 1 and 2. Frame element 300 may be made from any number of suitable materials, including plastic or wood, and may be configured to resemble an ornamental picture frame. In this embodiment, the face 215 may appear as a matting element and/or a separate matting element may be supplied.

Figure 5B:
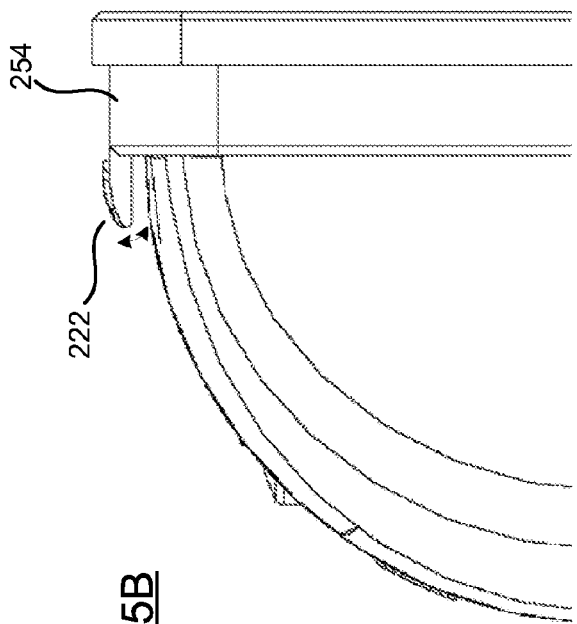
FIGS. 5B and 5C are enlarged side views of the flexible tabs shown without a frame element and with a frame element, respectively.
Figure 5C:
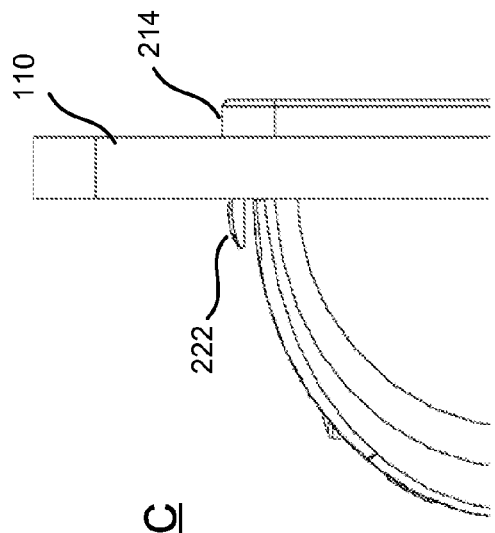
Figure 5A:
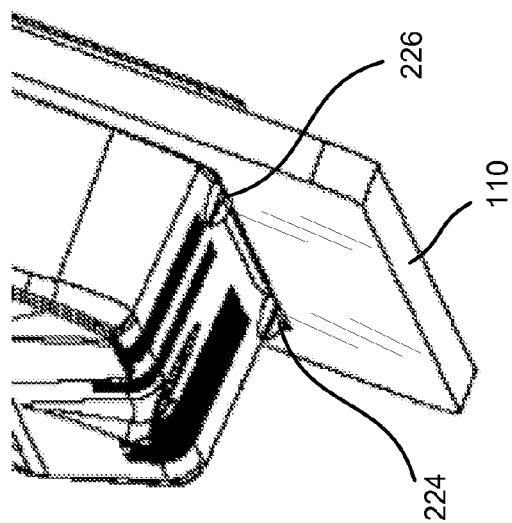
FIG. 5A is a partial perspective view of the apparatus shown in FIGS. 1A and 1B.

FIGS. 3A and 3B and 4A and 4B show side views and bottom views, respectively, of the housing 200 and frame element 110. FIGS. 3 and 4 illustrate the process for mounting the rear mounted frame element 110. As shown in FIGS. 3 and 4, the boundary edges 212, 214, 216 and 218 define a ridge which surrounds the frame face 205. Adjacent to the edges 212, 214, 216 and 218 are respective ledges 252, 254, 256, 258 upon which an inner opening 130 in the frame element 110 engages the frame housing 200. An opening 130 in frame element 110 is sized to fit snugly around the ledges 252, 254, 256, 258 such that the interior border 120 of the hole in frame element 110 engages ledges 252, 254, 256, 258. Flexible tabs 222, 224, 226, 228 having a sloped rear edge are manufactured of plastic and molded into housing 200. Tabs 222, 224, 226, 228 are positioned at the top and bottom of the housing to secure frame element 110 to the housing 200. When the frame element 110 is moved in the direction of the arrows shown in FIG. 3A to engage the frame as shown in FIG. 3B, the sloped edges of the tabs cause the tabs to flex toward the center of the frame housing 200. Once frame element 110 is positioned adjacent to edges 212, 214, 216 and 218, and the back of face 205, the tabs snap into place so that the flattened backend of the tab abuts the frame element secures the frame element 110 in position adjacent to the back of face 205. This is illustrated in FIG. 5A, which is a perspective view of the tabs engaging the frame element 110. FIGS. 5B and 5C illustrate how the frame element 110 engages the display 200 at ledge 254 and abuts the back 275 of face 205. Numerous other means are contemplated for securing the rear mounted frame element 110 to the housing 200, including, but not limited to, screws, clips, or other fastening elements.

FIGS. 6A, 6B and 7A, 7B illustrate the use of a front mounted frame element 300 with housing 200. Again, housing 200 is identical to the housing shown in FIGS. 1 through 5. In this illustration, the front mounted element 300 is designed to appear as a traditional picture frame and is noticeably thicker than the frame element 110 which is mounted from the rear of the housing 200. It will be recognized that the particular design of the various frame elements need not be identical to those herein. For example, the wood type frame element may be configured to mount from the rear of the housing and the acrylic or contemporary type element may be configured to mount from the front of the housing.

Figure 6B:
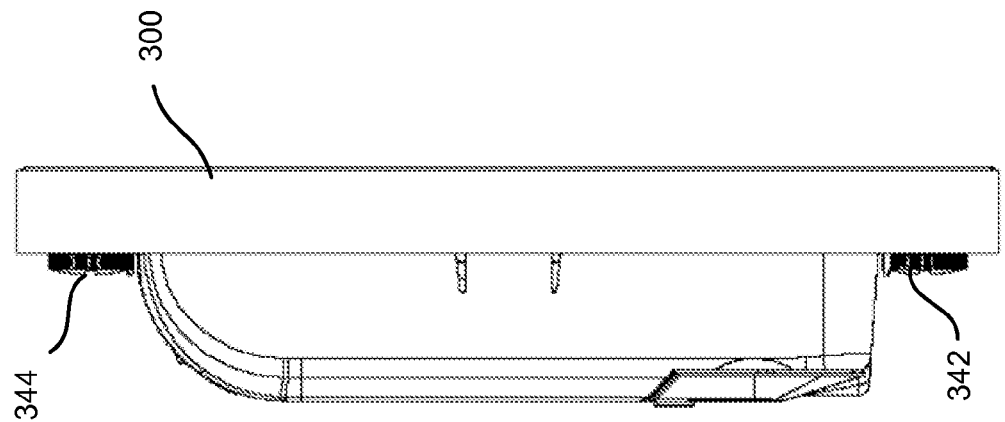
FIGS. 6A and 6B are disassembled and assembled side views, respectively, of the apparatus shown in FIGS. 2A and 2B.
Figure 6A:
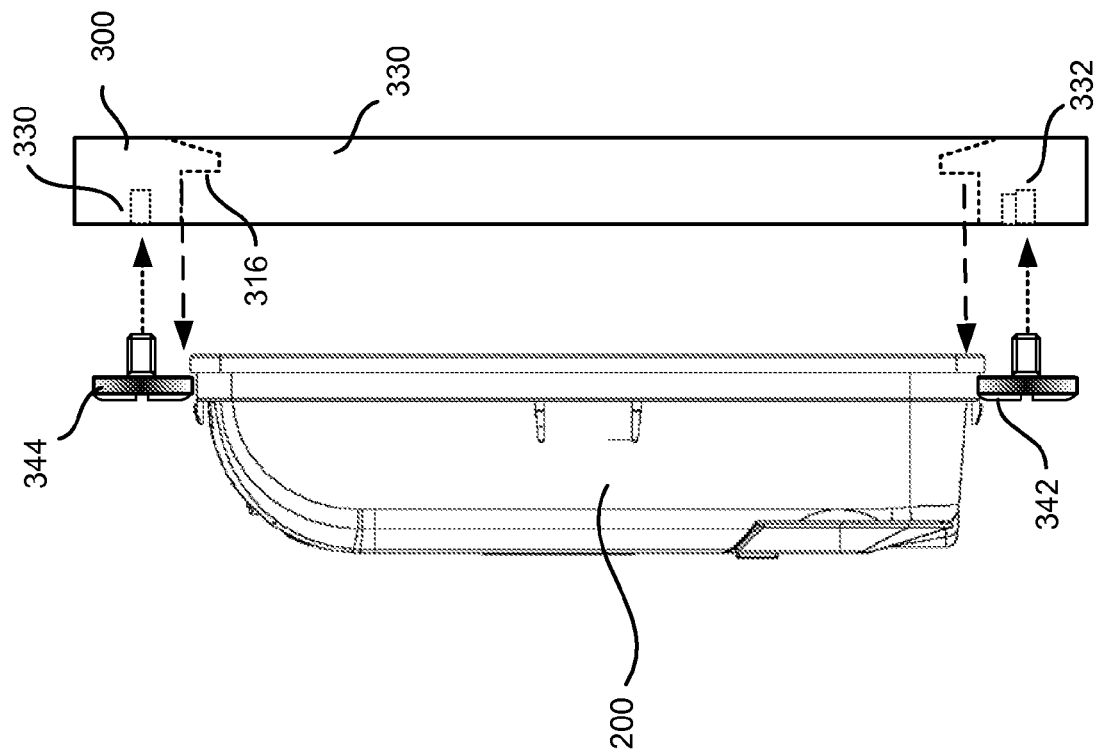

As shown in FIGS. 6A and 6B, the housing is positioned to be inserted within a cavity 330 in the frame element 300. Cavity 330 is defined by interior edges 312, 314, 332 and 334, as well as ledges 316, 318, 336, 338. The exterior edges 312, 314, 332 and 334 are sized so that they fit within the cavity 330 defined by walls 312, 314, 332, 334 to a point where the face of housing 200 abuts edges 316, 318, 336, 338. Once the frame is positioned within the cavity 330, threaded screws 344, 342 engage bores 330, 332 in the frame 300. Once again, the particular method of fastening the forward mounted frame element 300 to housing 200 may be accomplished by various fastening mechanisms.

Hence, a uniquely user-customizable digital display frame is provided. Consumers are provided the opportunity to switch between various styles of frames to better match the décor of their abode.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

I claim:

1. A digital media apparatus, comprising:
   a digital media display provided in a display housing, the housing having a front portion including a display face and a rear portion, the housing including a mounting region defined at an edge of the housing;
   a first decorative frame element mountable to the display housing by passing the rear portion of the housing through an opening in the first decorative frame element to allow the decorative frame element to engage the mounting region such that the face is positioned in front of the first decorative frame element;
   a second decorative frame element mountable to the display housing by passing a front portion of the display housing into a cavity in the frame element and securing the frame to the housing by a fastener, the cavity and the fastener engaging at least a portion of the mounting region, such that the face is positioned behind the second decorative frame element;
   only one of said first or second decorative element mountable to the display housing at a point in time.

2. The apparatus of claim 1 wherein the first decorative frame element comprises a plastic frame element.

3. The apparatus of claim 2 wherein the second decorative frame element comprises a wood frame element.

4. The apparatus of claim 1 wherein the mounting region is defined by a first ledge, a second ledge, a third ledge and a fourth ledge all positioned adjacent to a lip defined by the back of a face, and said opening in said frame engages each said ledge.

5. The apparatus of claim 4 further including a plurality of bendable tabs securing the first frame element to the housing.

6. The apparatus of claim 5 wherein each tab includes a sloped portion and a straight edge portion, the sloped portion engaging the first frame element as the rear portion of the housing is passed through the opening, the straight edge portion engaging the first decorative frame element in the mounting region and securing the element in the mounting region.

7. The apparatus of claim 1 wherein the mounting region is defined by a lip having a first edge, a second edge, a third edge and a fourth edge, the edges engaging the cavity.

8. The apparatus of claim 7 wherein the mounting region is further defined by a first ledge, a second ledge, a third ledge and a fourth ledge all positioned adjacent to said lip, and said opening in said decorative frame element engages each said ledge.

9. The apparatus of claim 8 wherein the display face is provided on the front portion of the display and engages said cavity.

10. The apparatus of claim 7 wherein the fastener is a threaded screw.

11. An apparatus, comprising:
    a digital picture display provided in a display housing, the housing having a front portion including a display face and a rear portion, the housing including a mounting region defined at an edge of the housing;
    a rear-mounted decorative frame element mountable to the display housing by passing the rear portion of the housing through an opening in the rear mounted decorative frame element to allow the rear mounted decorative frame element to engage the mounting region and position the rear mounted decorative frame is behind the display face;

a front mounted decorative frame mountable to the display housing by passing the front portion of the display housing into a cavity in the decorative frame element and securing the element to the housing by a fastener;

only one of said rear-mounted or front mounted decorative element mountable to the display housing at a point in time.

12. The apparatus of claim 11 wherein the rear decorative frame element comprises a plastic frame element.

13. The apparatus of claim 12 wherein the front decorative frame element comprises a wood frame element.

14. The apparatus of claim 11 wherein the mounting region is defined by a first ledge, a second ledge, a third ledge and a fourth ledge all positioned adjacent to a lip defined by the back of a face, and said opening in said first decorative frame element engages each said ledge.

15. The apparatus of claim 14 further including a plurality of bendable tabs securing the rear decorative frame element to the housing.

16. The apparatus of claim 15 wherein each tab includes a sloped portion and a straight edge portion, the sloped portion engaging the first decorative frame element as the rear portion of the housing is passed through the opening, the straight edge portion engaging the first frame element in the mounting region and securing the element in the mounting region.

17. The apparatus of claim 11 wherein the mounting region is defined by a lip having a first edge, a second edge, a third edge and a fourth edge, the edges engaging the cavity.

18. The apparatus of claim 17 wherein the mounting region is further defined by a first ledge, a second ledge, a third ledge and a fourth ledge all positioned adjacent to said lip, and said opening in said rear decorative frame element engages each said ledge.

* * * * *